(12) United States Patent
Grosse et al.

(10) Patent No.: US 8,468,503 B2
(45) Date of Patent: Jun. 18, 2013

(54) METHOD FOR TESTING A COMPUTER PROGRAM

(75) Inventors: Joerg Grosse, Schliersee-Neuhaus (DE); Mark Hampton, Andre (FR)

(73) Assignee: Synopsys, Inc., Mountain View, CA (US)

( * ) Notice: Subject to any disclaimer, the term of this patent is extended or adjusted under 35 U.S.C. 154(b) by 774 days.

(21) Appl. No.: 12/516,546

(22) PCT Filed: Nov. 28, 2007

(86) PCT No.: PCT/DE2007/002146
§ 371 (c)(1),
(2), (4) Date: Feb. 24, 2010

(87) PCT Pub. No.: WO2008/064658
PCT Pub. Date: Jun. 5, 2008

(65) Prior Publication Data
US 2010/0146490 A1    Jun. 10, 2010

(30) Foreign Application Priority Data
Nov. 28, 2006  (DE) .................. 10 2006 056 432

(51) Int. Cl.
*G06F 9/44* (2006.01)
*G06F 11/00* (2006.01)

(52) U.S. Cl.
USPC ........... 717/131; 717/124; 717/126; 717/128; 714/38.1

(58) Field of Classification Search
None
See application file for complete search history.

(56) References Cited

U.S. PATENT DOCUMENTS

| 3,711,863 A | 1/1973 | Bloom |
| 5,694,540 A | 12/1997 | Humelsine et al. |
| 5,784,553 A * | 7/1998 | Kolawa et al. ............... 714/38.1 |
| 5,805,795 A | 9/1998 | Whitten |

(Continued)

FOREIGN PATENT DOCUMENTS

| EP | 0684557 A2 | 11/1995 |
| FR | 2873832 | 2/2006 |

OTHER PUBLICATIONS

J H Andrews et al., "Is Mutation an Appropriate Tool for Testing Experiments?", [Online], May 2005, pp. 402-411, [Retrieved from Internet on Jul. 26, 2012], <http://ieeexplore.ieee.org/stamp/stamp.jsp?tp=&arnumber=1553583&tag=1>.*

(Continued)

*Primary Examiner* — Thuy Dao
*Assistant Examiner* — Ziaul A Chowdhury
(74) *Attorney, Agent, or Firm* — Kilpatrick Townsend & Stockton LLP

(57) ABSTRACT

Methods for testing a computer program after changing a first version of the computer program into a second version of the computer program due to a revision of the computer program are provided. In one aspect, the method includes determining mutations inserted into the first version of the computer program, and the mutations inserted into the second version of the computer program, and comparing the first version of the computer program with the second version of the computer program to determine changed and unchanged mutations in the second version against the first version. The mutations that can be inserted only in the first version of the computer program or only in the second version of the computer program are classified as changed mutations and the mutations that can be inserted in the first and the second version are classified as unchanged mutations.

20 Claims, 2 Drawing Sheets

U.S. PATENT DOCUMENTS

Figure 1A:
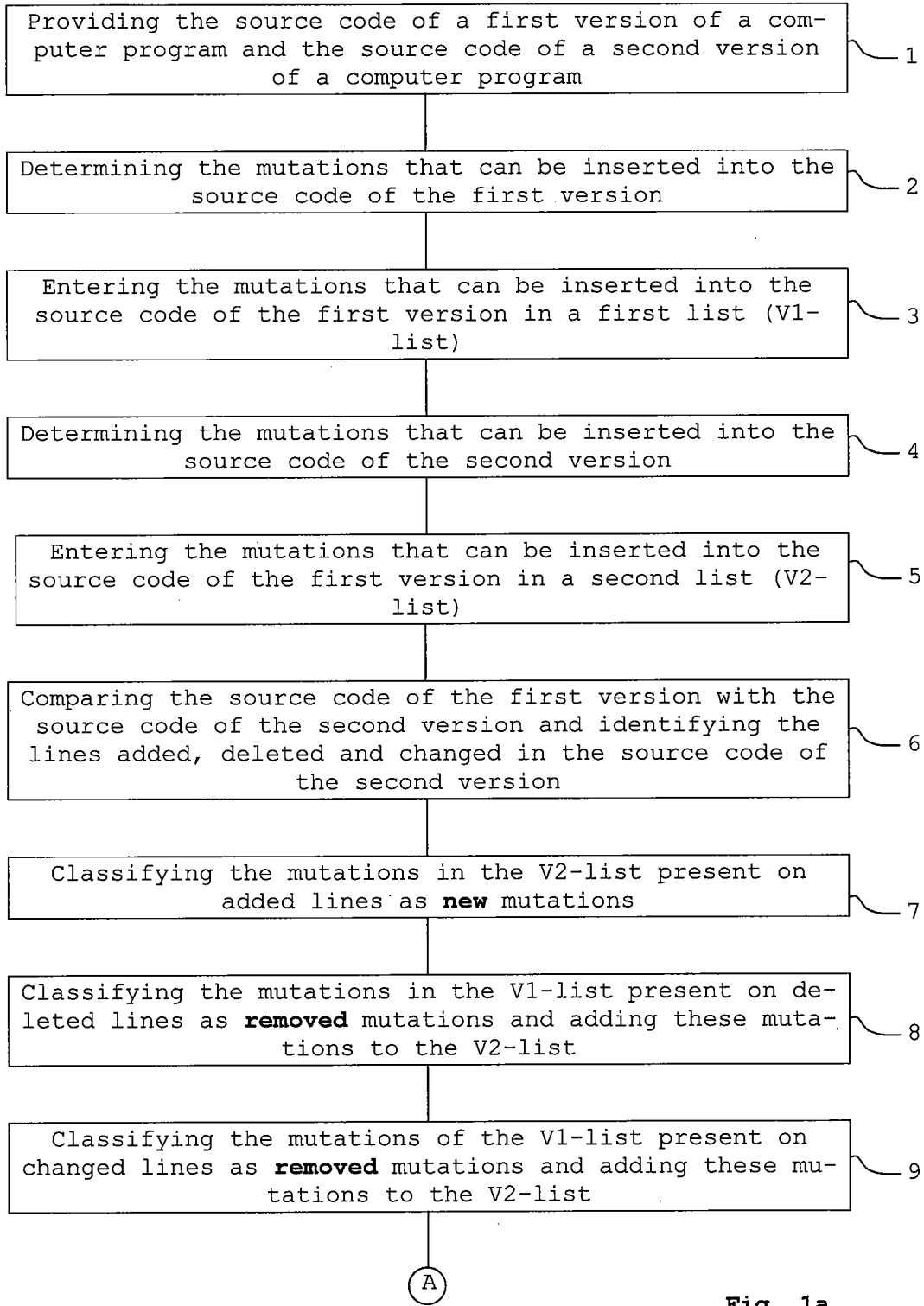

| | | | |
|---|---|---|---|
| 6,298,317 B1 * | 10/2001 | Wiemann | 703/22 |
| 6,931,629 B1 * | 8/2005 | Yount et al. | 717/126 |
| 6,948,154 B1 * | 9/2005 | Rothermel et al. | 717/128 |
| 7,574,681 B2 * | 8/2009 | Hampton | 716/136 |
| 7,849,448 B2 * | 12/2010 | Yunus et al. | 717/126 |
| 7,873,945 B2 * | 1/2011 | Musuvathi et al. | 717/124 |
| 8,276,126 B2 * | 9/2012 | Farnham et al. | 717/131 |
| 2009/0044177 A1 * | 2/2009 | Bates et al. | 717/131 |

OTHER PUBLICATIONS

Sunwoo Kim et al., "Class Mutation: Mutation Testing for Object-Oriented Programs" [Online], 2000,pp. 1-15, [Retrieved from Internet on Jul. 26, 2012], <http://citeseerx.ist.psu.edu/viewdoc/download?doi=10.1.1.31.7963&rep=rep1&type=pdf>.*

W. Richards Adrion et al., "Validation, Verification, and Testing of Computer Software", [Online], Jun. 1982, pp. 159-192, [Retrieved from Internet on Feb. 2, 2013], <https://www.cs.drexel.edu/~jhk39/teaching/cs576su06/week1Reading/adrion.pdf>.*

A. Je_erson O_utt et al., "Experiments with Data Flow and Mutation Testing", [Online], Feb. 1994, pp. 1-13, [Retrieved from Internet on Feb. 2, 2013], <http://cs.gmu.edu/~tr-admin/papers/ISSE-TR-94-05.pdf>.*

Juliano R. Toaldo et al., "Applying Mutation Testing in Prolog Programs", [Online], 2008, pp. 1-12, [Retrieved from Internet on Feb. 2, 2013], <http://citeseerx.ist.psu.edu/viewdoc/download?doi=10.1.1.88.5328&rep=rep1&type=pdf>.*

W.K. Chan et al., "Fault-Based Testing of Database Application Programs with Conceptual Data Model", [Online], IEEE-2005, pp. 1-11, [Retrieved from Internet on Feb. 2, 2013], <http://citeseerx.ist.psu.edu/viewdoc/download?doi=10.1.1.60.4601&rep=rep1&type=pdf>.*

Geist, Robert et al: Estimation and Enhancement of Real-Time Software Reliability Through Mutation Analysis. In: IEEE Transactions on Computer, vol. 41, No. 5, May 1992, pp. 550-558.

Software Mutation Testing, Jan. 21, 2003 [searched on: Nov. 13, 2007] in 2 pages at http://everything2.com/index.pl?node_id=1418661&displaytype=printable&lastnode_id=1418661.

Vado et al: "A Methodology for Validating Digital Circuits with Mutation Testing" (May 1, 2000) in 4 pages.

* cited by examiner

METHOD FOR TESTING A COMPUTER PROGRAM

BACKGROUND

1. Field

The Invention relates to a method for testing a computer program after changing a first version of the computer program into a second version of the computer program due to a revision of the computer program.

2. Description of the Related Art

According to the state of the art the development of a computer program is associated with a time-consuming test method to detect errors in the computer program. Only in rare cases computer programs are written completely new. As a rule, the last version of the computer program is adapted to implement new functions or to correct problems. Such a new version of the computer program requires a completely testing of the software. However, there have been developed methods for the selective testing of new versions of the computer program that should permit a reduction of the testing effort.

Thus, the state of the art is based on using code coverage results that are obtained from testing the first version of the computer program. Here, coverage means that specific statements have been performed while the program was performed. However, a disadvantage of these methods is that tests are performed which perhaps have no effect on changes of the source code at all. In other words, there is no proof that the tests selected on the basis of the coverage results test features that relate to the change of the code. For this reason, the employment of such methods in modern test environments using constrained random tests is not or scarcely useful. This relates in particular to the validation of circuits.

SUMMARY

It is an object of the invention to eliminate the drawbacks based on the prior art. In particular, there is indicated a method that permits a fast and more effective testing of a changed version of a computer program and is suitable for testing computer programs that define a circuit. Further, there are indicated uses of said method.

DETAILED DESCRIPTION

This object is solved by the features of claims 1 and 21. Suitable embodiments of the invention arise from the features of claims 2 to 20, 22 and 23.

According to the invention there is provided a method for testing a computer program after changing a first version of the computer program into a second version of the computer program due to a revision of the computer program, comprising (a) determining the mutations that can be or have been inserted into the first version of the computer program, and the mutations that can be inserted into the second version of the computer program; and (b) comparing the first version of the computer program with the second version of the computer program to determine changed and unchanged mutations in the second version against the first version, wherein (b1) the mutations present only in the first version of the computer program or only in the second version of the computer program are classified as changed mutations; and (b2) the mutations present in the first and the second version are classified as unchanged mutations.

A mutation is a deliberate change of the computer program. Mutations are inserted into the source code of the computer program for the mutation analysis and then analyzed by the mutation analysis. For example, mutations can be logic negation errors, omission of logic factors, incorrect logic factors, omissions of logic expressions, incorrect logic expressions, incorrect numerical values and case omissions.

With the mutation analysis it could be checked whether a mutation inserted into the computer program can be detected with at least one test ("test case") of the test set intended for testing the computer program ("test bench"). In this case, detection means that the test shows an error. Undetected mutations reveal whether the tests of a test set are sufficient to test the computer program. If one mutation is undetected by means of the existing tests of the test set, one test in the test set is absent or one or more tests in the test set are incomplete. In this case, the test set is incomplete. Thus, the mutation analysis permits an examination of the completeness of the test set that is to be used for testing the (unmutated) computer program.

By regression testing is meant the repeated performance of the tests of the test set that are used for testing the first version of the computer program, for testing the second version of the computer program. However, according to the invention there may be intended that additional tests are performed if the mutation analysis shows that the test set used for testing the first version of the computer program is incomplete.

According to the invention in step (a) are determined the mutations that can be inserted into the first version and the mutations that can be inserted into the second version. Methods for determining the mutations are known to the skilled person. It is essential that here the same previously set criteria are used for both versions for the selection of the mutations from one given set of mutations. To perform the method it is not required to insert the mutations into the source code actually. It is enough to know the mutation and the position at which it can be inserted.

Step (b) provides the comparison of the two versions to determine changed and unchanged mutations. Here it is preferred to compare the source code of the two versions with each other so that the changes made in the source code can be ascertained. With the help of these changes it is determined which mutations are affected by the changes (changed mutations) and which are not (unchanged mutations).

In a first embodiment of the invention the method comprises after step (b)

(c) the use of all or a part of the mutations which in step (b) have been classified as changed mutations for testing the second version of the computer program.

In a second embodiment of the invention the method comprises after step (b)

(c) the use of all or a part of the mutations which in step (b) have been classified as changed mutations for the mutation analysis of the second version of the computer program.

In a third embodiment of the invention the method comprises after step (b)

(c) the use of all or a part of the mutations which in step (b) have been classified as changed mutations for regression testing of the second version of the computer program.

In a fourth embodiment of the invention the method comprises after step (b)

(c) the use of all or a part of the mutations which in step (b) have been classified as changed mutations for the mutation analysis or regression testing of the second version of the computer program.

In all of the above-mentioned embodiments the results of a mutation analysis of the first version of the computer program obtained with the mutations that have been classified as unchanged mutations can readily be transferred to the second version, i.e. it is believed that the results of the unchanged mutations would be the same results with a mutation analysis of the second version of the computer program that have been already achieved with the mutation analysis of the first version of the computer program. In this way for example the results achieved with the mutation analysis of the first version of the computer program that consist in which unchanged mutations have been detected and which not can be transferred to the second version, i.e. it is believed that the unchanged mutations are or are not detected in the same way as with the first version.

Further, independent from the particular embodiment it can be provided that in step (b) as changed mutation classified mutations present in the second version but not in the first version are classified as new mutations. In addition, mutations classified as changed mutations in step (b) present in the first version but not in the second version can be classified as removed mutations.

Preferably, there is carried out a mutation analysis of the new mutations to test the second version of the computer program. However, if the mutation analysis of the new mutations resulted in that the test set used for testing the first version is not complete, so the second version is characterized as not completely tested or the test set is supplemented by such tests. Thereafter, the tests of the (supplemented) test set can be performed which are able to detect the new mutations.

Alternative or additionally, there may be carried out tests for testing the second version of the computer program that detected the mutations classified as removed mutations with a mutation analysis of the first version of the computer program. Performing these tests is hereinafter also designated as "reduced regression testing".

However, for testing the second version of the computer program in step (c) either only a mutation analysis of the new mutations with subsequently regression testing of the second version of the computer program or only performing tests that detected the mutations classified as removed mutations with a mutation analysis of the first version of the computer program may be provided.

In a preferred embodiment testing the second version of the computer program in step (c) comprises the steps of:
(c1) performing tests that upon a mutation analysis of the first version of the computer program detected the mutations classified as removed mutations to ascertain whether the second version of the computer program passes these tests; and
(c2) subsequently performing a mutation analysis of the new mutations provided that the second version has passed all test carried out in step (c1).

Alternative, there may be provided that testing the second version of the computer program in step (c) comprises the steps of:
(c1) performing tests that upon a mutation analysis of the first version of the computer program detected the mutations classified as removed mutations to ascertain whether the second version of the computer program passes these tests; and
(c2) subsequently performing a mutation analysis of the new mutations.

Further it may be provided that testing the second version of the computer program in step (c) comprises the steps of:
(c1) performing tests that upon a mutation analysis of the first version of the computer program detected the mutations classified as removed mutations to ascertain whether the second version of the computer program passes these tests; and
(c2) subsequently performing the remaining tests that were used for testing the first version of the computer program.

Preferably, the mutations present in the first version of the computer program are entered in a first list and the mutations present in the second version of the computer program are entered in a second list, wherein in step (b) the first list and the second list are compared with each other in order to classify the mutations.

Particular preferred is that in step (b) the mutations are classified as new mutations that either
(b11) can be inserted into lines, statements and/or expressions of the source code of the second version which have been added to the second version of the computer program compared to the first version of the computer program; and/or
(b12) can be inserted into lines, statements and/or expressions of the source code of the second version which have been changed in the second version of the computer program compared to the first version of the computer program.

Further, mutations can be classified as removed mutations that either
(b13) can be inserted into lines, statements and/or expressions of the source code of the first version which have been deleted in the second version of the computer program compared to the first version of the computer program; and/or
(b14) can be inserted into lines, statements and/or expressions of the source code of the first version which have been changed in the second version of the computer program compared to the first version of the computer program.

Here it is preferred to classify all mutations not classified as new mutations or as removed mutations as unaffected mutations.

In one embodiment of the invention the second version of the computer program is in comparison to the first version assessed as "not deteriorated" if the tests are passed that detected upon a mutation analysis of the first version of the computer program the mutations classified as removed mutation. Further may be provided that the source code containing not detected new mutations classified as new mutations upon mutation analysis is characterized as not sufficient tested.

Preferably the source code describes an integrated circuit IC).

The method according to the invention may be carried out using a Field Programmable Gate Array (FPGA).

The method according to the invention allows a fast locating of an incorrect change of a computer program. This is particularly attributed to the fact that selective mutations are used for the testing that are determined by the classification of mutations that can be found in the compared versions of the computer program. Moreover, with the suggested classification it is possible to recognize errors attributable to changes of the code earlier than before, because at first there are carried out tests that would detect removed mutations ("reduced regression testing"). If the tests have been passed in the first version and if there appear errors upon performing the tests in the second version, so the change of the source code from the first to the second version has led to this error. Therefore, the second version is incorrect. Subsequently the mutations classified as new can be subjected to a mutation analysis. Alternative, at first a mutation analysis of the new mutations can be carried out and then tests that detected the mutations classified as removed mutations upon testing the first version of the computer program can be performed.

The method according to the invention may be used advantageously for regression testing of computer programs and/or for the mutation analysis of computer programs.

The invention is hereinafter discussed in more detail with reference to the drawings on the basis of an example. Here, FIGS. 1a and b are showing a flow chart of an embodiment of the method according to the invention.

In the embodiment of the method according to the invention described below the first version of the computer program is compared to the second version of the computer program (see, reference number 1 in FIG. 1a). This can be done using a File Comparison Tool also known as diff tool or with the help of a syntax tree analysis.

Hereinafter, there is represented the source code of a first version of a computer program:

| | |
|---|---|
| 1 | always @(posedge clk or negedge reset_n) begin |
| 2 | if(~reset_n ) begin |
| 3 | q_r <= 1'b0; |
| 4 | end |
| 5 | else begin |
| 6 | q_r <= d & enable; |
| 7 | q_n_r <= d & enable; |
| 8 | end |
| 9 | enable <= 1'b0; |
| 10 | end |

After the revision of the computer program the second version is obtained:

| | |
|---|---|
| 1 | always @(posedge clk or negedge reset_n) begin |
| 2 | if(~reset_n ) begin |
| 3 | q_r <= 1'b0; |
| 4 | q_n_r <= 1'b1; |
| 5 | end |
| 6 | else begin |
| 7 | q_r <= d & enable; |
| 8 | q_n_r <= ~d & enable; |
| 9 | end |
| 10 | end |

For the classification of the mutants as new mutants, removed mutants, and changed mutants the two versions of the computer program are compared to each other. For that, at first the mutations are determined that can be inserted into the first version (reference mark 2 in FIG. 1a). These mutations, i.e. its positions ("line") in the source code of the first version, are stored in a first list, in the following referred to as "V1-list" (reference mark 3 in FIG. 1). Here an identification number (ID-No.) is assigned to each mutation. Further the type of the mutant in the V1-list is stored.

| V1-list: | | |
|---|---|---|
| ID-No. | line | type |
| 1 | 2 | if |
| 2 | 3 | <= |
| 3 | 3 | constant 0 |
| 4 | 6 | <= |
| 5 | 6 | operator & |
| 6 | 7 | <= |
| 7 | 7 | operator & |
| 8 | 9 | <= |
| 9 | 9 | constant 0 |

Figure 1B:
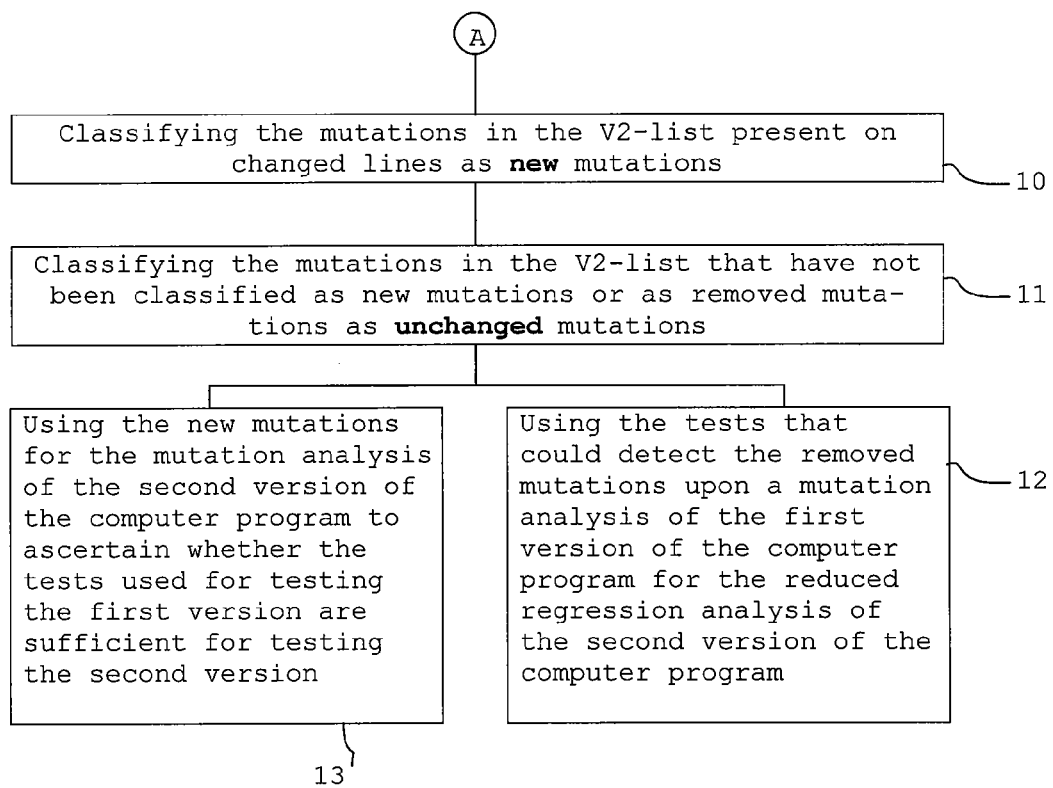

Thereafter, the mutations are determined that can be inserted into the second version of the computer program (reference mark 4 in FIG. 1a). These mutations, i.e. its positions in the source code of the first version, are stored in a list, in the following referred to as "V2-list" (reference mark 5 in FIG. 1a). Here an identification number ("ID-No.") is assigned to each mutation. Further the type of the mutant in the V2-list is stored.

| V2-list | | |
|---|---|---|
| ID-No. | line | type |
| 1 | 2 | if |
| 2 | 3 | <= |
| 3 | 3 | constant 0 |
| 4 | 4 | <= |
| 5 | 4 | constant 1 |
| 6 | 7 | <= |
| 7 | 7 | operator & |
| 8 | 8 | <= |
| 9 | 8 | operator & |
| 10 | 8 | operator ~ |

The comparison (reference mark 6 in FIG. 1a) of the source code of the first version of the computer program to the source code of the second version of the computer program using the diff tool gives the following result:

| column 1 | column 2 |
|---|---|
| 3a4 > | q_n_r <= 1'b1; |
| 7c8 < | q_n_r <= d & enable; |
| ---> | q_n_r <= ~d & enable; |
| 9d9 < | enable <= 1'b0; |

The expressions represented in column 1 are in the form of "XyZ", wherein X designates the line in the source code of the first version of the computer program; y represents whether the line in the second version has been added (designated with "a"), whether the line in the second version has been changed (designated with "c"), or whether the line in the second version has been deleted (designated with "d"); and Z designates the line in the source code of the second version of the computer program. Column 2 represents the type of the change.

The result of the comparison with the help of the diff tool is used to classify the mutations.

All mutants in the V2-list that are on added lines (designated with "a") are classified as new mutations ("new") (reference mark 7 in FIG. 1a):

| V2-list | | | |
|---|---|---|---|
| ID-No. | line | type | classified as |
| 1 | 2 | if | |
| 2 | 3 | <= | |
| 3 | 3 | constant 0 | |
| 4 | 4 | <= | new |
| 5 | 4 | constant 1 | new |
| 6 | 7 | <= | |
| 7 | 7 | operator & | |
| 8 | 8 | <= | |
| 9 | 8 | operator & | |
| 10 | 8 | operator ~ | |

Thereafter, all mutations present in the V1-list and on deleted lines (designated with removed) are added to the V2-list and classified as removed mutations ("removed") (reference mark 8 in FIG. 1*a*):

| | | V2-list | |
|---|---|---|---|
| ID-No. | line | type | classified as |
| 1 | 2 | if | |
| 2 | 3 | <= | |
| 3 | 3 | constant 0 | |
| 4 | 4 | <= | new |
| 5 | 4 | constant 1 | new |
| 6 | 7 | <= | |
| 7 | 7 | operator & | |
| 8 | 8 | <= | |
| 9 | 8 | operator & | |
| 10 | 8 | operator ~ | |
| 11 | 9 | <= | removed |
| 12 | 9 | constant 0 | removed |

Then, all mutations present in the V1-list and on changed lines are added to the V2-list and classified as removed mutations ("removed") (reference mark 9 in FIG. 1*a*):

| | | V2-list | |
|---|---|---|---|
| ID-No. | line | type | classified as |
| 1 | 2 | if | |
| 2 | 3 | <= | |
| 3 | 3 | constant 0 | |
| 4 | 4 | <= | new |
| 5 | 4 | constant 1 | new |
| 6 | 7 | <= | |
| 7 | 7 | operator & | |
| 8 | 8 | <= | |
| 9 | 8 | operator & | |
| 10 | 8 | operator ~ | |
| 11 | 9 | <= | removed |
| 12 | 9 | constant 0 | removed |
| 13 | 7 | <= | removed |
| 14 | 7 | operator & | removed |

Then, all mutations present in the V2-list and on changed lines are classified as new mutations (reference mark 10 in FIG. 1*b*):

| | | V2-list | |
|---|---|---|---|
| ID-Nr. | line | type | classified as |
| 1 | 2 | if | |
| 2 | 3 | <= | |
| 3 | 3 | constant 0 | |
| 4 | 4 | <= | new |
| 5 | 4 | constant 1 | new |
| 6 | 7 | <= | |
| 7 | 7 | operator & | |
| 8 | 8 | <= | new |
| 9 | 8 | operator & | new |
| 10 | 8 | operator ~ | new |
| 11 | 9 | <= | removed |
| 12 | 9 | constant 0 | removed |
| 13 | 7 | <= | removed |
| 14 | 7 | operator & | removed |

Finally, all mutations in the V2-list not classified as new or removed mutations are classified as unchanged mutations ("unchanged") (reference mark 11 in FIG. 1*b*):

| | | V2-list | |
|---|---|---|---|
| ID-Nr. | line | type | classified as |
| 1 | 2 | if | unchanged |
| 2 | 3 | <= | unchanged |
| 3 | 3 | constant 0 | unchanged |
| 4 | 4 | <= | new |
| 5 | 4 | constant 1 | new |
| 6 | 7 | <= | unchanged |
| 7 | 7 | operator & | unchanged |
| 8 | 8 | <= | new |
| 9 | 8 | operator & | new |
| 10 | 8 | operator ~ | new |
| 11 | 9 | <= | removed |
| 12 | 9 | constant 0 | removed |
| 13 | 7 | <= | removed |
| 14 | 7 | operator & | removed |

In one embodiment (reference mark 12 in FIG. 1*b*) there are used at first or exclusively the mutants classified in the V2-list as removed mutations for the reduced regression testing of the second version of the computer program. Here, the second version of the computer program is assessed as "not deteriorated" against the first version if the tests are passed that detected upon a mutation analysis of the first version of the computer program the mutations classified as removed mutations.

In another embodiment (reference mark 13 in FIG. 1*b*) of the invention there are used at first or exclusively the mutants classified in the V2-list as new mutations for the mutation analysis of the second version of the computer program. Source code containing not detected new mutants classified upon the mutation analysis of the mutations as new mutations is characterized for the tester as not sufficiently tested.

Thus, by the classification of the mutations and the use of at first or exclusively the mutations either classified as new or removed for testing the second version of the computer program the invention is considerably saving time over the known methods due to the fast locating of incorrect changes since the classification and subsequent selection of particular mutations permits performing only of that tests which are able to detect said mutations.

For example, if at first (or exclusively) tests are carried out that are able to detect mutations which have been detected in the first version and classified as removed mutations, so in a very early state of the test can be recognized whether in the first version existing features of the computer program that shall not be affected by its revision have been impaired. Removed mutations represent a change of feature. In view of the aim of the regression analysis to assure that all changes of source code are tested a minimum amount ("subset") of tests is selected by selecting only that tests detecting removed mutations which according to the analysis of the first version are known to be able to detect possible problems closely related to the changes made. The selected tests have to be passed to confirm that the source code of the second version is still correct. This results in a fast assessment whether the changes made are incorrect.

On the other hand, if at first (or exclusively) a mutation analysis is carried out to find out which of the mutations classified as new mutations can be detected by tests of the test set used for testing the first version of the computer program, so not detected mutants show that the test set is not complete, i.e. comprises no tests which are able to detect at least one particular new mutation. In this way it is possible to find out whether the new features are actually tested by the test set used.

Preferably, at first there are carried out tests that are able to detect mutations that have been detected in the first version and classified as removed mutations. Thereafter, a mutation analysis of the new mutations is conducted.

The invention claimed is:

1. A method implemented using a processor of a computer system for testing a computer program after changing a first version of the computer program into a second version of the computer program due to a revision of the computer program, comprising:
   determining first mutations that are insertable into the first version of the computer program, and second mutations that are insertable into the second version of the computer program;
   comparing the first version of the computer program with the second version of the computer program to determine, from among the first mutations and the second mutations, changed and unchanged mutations in the second version of the computer program compared to the first version of the computer program,
   wherein the determined mutations that are limited in insertion to the first version of the computer program and not the second version of the computer program or that are limited in insertion to the second version of the computer program and not the first version of the computer program are classified as the changed mutations, and
   wherein the determined mutations that are insertable in the first version of the computer program and the second version of the computer program are classified as the unchanged mutations; and
   generating information configured to test the second version of the computer program using at least a portion of the determined mutations classified as the changed mutations.

2. The method of claim 1, further comprising using at least a portion of the changed mutations for mutation analysis of the second version the computer program.

3. The method of claim 1, wherein results of a mutation analysis of at least a portion of the determined mutations that are insertable into the first version of the computer program and classified as the changed mutations are used to select tests for reduced regression testing of the second version of the computer program.

4. The method of claim 1 wherein results of a mutation analysis of at least a portion of the determined mutations that are insertable into the first version of the computer program and classified as the changed mutations are used to select tests for reduced regression testing of the second version of the computer program and wherein at least a portion of the determined mutations classified as the changed mutations and limited in insertion to the second version of the computer program and not the first version of the computer program are used for mutation analysis of the second version of the computer program.

5. The method of claim 1 wherein the determined mutations classified as the changed mutations that are limited in insertion to the second version of the computer program and not the first version of the first version are classified as new mutations.

6. The method of claim 5 wherein mutation analysis of the new mutations is conducted for testing the second version of the computer program.

7. The method of claim 5 wherein a single mutation analysis of the new mutations is conducted for testing the second version of the computer program.

8. The method of claim 5 wherein the new mutations comprise at least one of mutations that can be inserted into lines, statements and/or expressions of source code of the second version of the computer program that have been added to the second version of the computer program as compared to the first version of the computer program or mutations that can be inserted into lines, statements and/or expressions of the source code of the second version of the computer program that have been changed in the second version of the computer program as compared to the first version of the computer program.

9. The method of claim 1 wherein the determined mutations classified as the changed mutations that are limited in insertion to the first version of the computer program and not the second version of the computer program are classified as removed mutations.

10. The method of claim 9 wherein the removed mutations are used for testing the second version of the computer program.

11. The method of claim 9 wherein the removed mutations comprise at least one of mutations that can be inserted into lines, statements and/or expressions of source code of the first version of the computer program and that have been deleted in the second version of the computer program as compared to the first version of the computer program or mutations that can be inserted into lines, statements or expressions of the source code of the first version of the computer program that have been changed in the second version of the computer program as compared to the first version of the computer program.

12. The method of claim 9 wherein the determined mutations that can be inserted into lines, statements or expressions of source code of the second version of the computer program and that have not been classified as new mutations or as removed mutations are classified as the unchanged mutations.

13. The method of claim 1 wherein testing the second version of the computer program comprises the steps of:
   using removed mutations to test whether the second version of the computer program passes a set of tests; and
   performing mutation analysis of new mutations when the second version of the computer program has passed the set of tests.

14. The method of claim 1 wherein testing the second version of the computer program comprises the steps of:
   using removed mutations to test whether the second version of the computer program passes a set of tests; and
   performing mutation analysis of new mutations.

15. The method of claim 1 wherein testing the second version of the computer program comprises the steps of:
   using removed mutations to test whether the second version of the computer program passes a subset of tests in a set of tests used to test the first version of the computer program; and
   using the changed mutations to test whether the second version of the computer program passes each test in the set of tests when the second version has passed each test in the subset of tests.

16. The method of claim 1 wherein the second version of the computer program is assessed as not deteriorated compared to the first version of the computer program when removed mutations are identified.

17. The method of claim 1 wherein source code of the first computer program or source code of the second computer program comprising undetected new mutations is characterized as insufficiently tested.

18. The method of claim 1 wherein source code for at least one of the first version of the computer program or the second version of the computer program is configured for use with an integrated circuit.

19. The method of claim 1 wherein the method is implemented using a Field Programmable Gate Array (FPGA).

20. A non-transitory computer-readable medium storing code executable by a processor of a computer system for testing a computer program after changing a first version of the computer program into a second version of the computer program due to a revision of the computer program, the non-transitory computer-readable medium comprising:

code for determining first mutations that are insertable into the first version of the computer program, and second mutations that are insertable into the second version of the computer program;

code for comparing the first version of the computer program with the second version of the computer program to determine, from among the first mutations and the second mutations, changed and unchanged mutations in the second version of the computer program compared to the first version of the computer program, wherein the determined mutations that are limited in insertion to the first version of the computer program and not the second version of the computer program or that are limited in insertion to the second version of the computer program and not the first version of the computer program are classified as the changed mutations, and wherein the determined mutations that are insertable in the first version of the computer program and the second version of the computer program are classified as the unchanged mutations; and code for generating information configured to test the second version of the computer program using at least a portion of the determined mutations classified as the changed mutations.

\* \* \* \* \*